SELF-BIASING VARACTOR FREQUENCY MULTIPLIER

Filed Feb. 8, 1963

INVENTOR.
Tommy S. Weaver,
BY
H. H. Losche
Att'ys.

United States Patent Office 3,287,621
Patented Nov. 22, 1966

3,287,621
SELF-BIASING VARACTOR FREQUENCY MULTIPLIER

Tommy S. Weaver, Arnold, Md., assignor, by mesne assignments, to the United States of America as represented by the Secretary of the Navy Filed Feb. 8, 1963, Ser. No. 257,352
2 Claims. (Cl. 321—69)

This invention relates to frequency multiplier circuits and more particularly to frequency multiplier circuits using microwave-frequency junction semiconductor nonlinear capacitance diodes providing variable reactance, presently becoming known as "varactors," which are capable of generating strong harmonics when excited by a fundamental frequency. By proper filtering the desired harmonic frequency can be selected and used.

Nonlinear resistance devices hav long been used for frequency multiplication and harmonic generation but these devices are very limited in their capabilities of handling power and are not considered to be very efficient. Nonlinear capacitance devices, such as variable reactors of the junction semiconductor diode type referred to herein, are greatly superior to the nonlinear resistance devices in efficiency and power handling capabilities. These nonlinear capacitance devices, or variable reactors, will be referred to hereinafter as varactors or varactor diodes.

Varactor multipliers have generally been of the fixed bias type. These require a direct current (D.C.) power supply and associated decoupling networks in order to operate. Varactors have also been used in a D.C. shorted or D.C. open condition but at reduced efficiency and stability. Varactor multipliers operate at greatest efficiency when biased such that they are slightly conducting over a small portion of a cycle, which conduction produces rectification of the frequency cycle. This rectification action may be used to produce self bias by direct current voltage on the varactor diode.

In the present invention a varactor multiplier network is coupled to a point in a coaxial line where frequency multiplication is desired. The input frequency signal to this junction point is filtered to produce a closed circuit for the input frequency and an open circuit for all other frequencies. A tuner is also coupled to the input preceding the junction point and tuned to the input fundamental frequency. A tuner and filter, tuned and filtered to pass the desired multiplied output frequency, are coupled to the output from the junction point. The varactor may be particularly constructed for developing good frequency harmonics as explained in the Radio Corporation of America Review, volume 21 (1960), page 457, in the article The Design of Varactor Diodes, by J. Hillibrand and C. F. Stocker. The varactor has its cathode coupled to the junction point of the coaxial line and its anode coupled to a fixed potential through a parallel variable resistance and capacitance network. A potentiometer may be used for the variable resistance which is adjustable to vary the bias on the varactor by using the varactor diode rectification property to effect this D.C. bias control. The potentiometer or variable resistance provides a variable D.C. return on the varactor for the purpose of providing optimum self bias without the necessity of an external D.C. bias source. The varactor, potentiometer, and capacitor are all housed in a separable holder which also serves as a coupler for the coaxial line. The housing or holder has the potentiometer or variable resistor positioned with the adjustable tap thereof adjustable from the exterior to permit adjustment of the varactor bias during circuit operation. It is therefore a general object of this invention to provide a varactor diode frequency multiplying circuit that is adjustably self-biased to produce optimum efficiency in generating frequency harmonics for the selected multiplied frequency, this circuit being housed in a separable holder serving as a coupling for the frequency conductor.

These and other objects and the many attendant advantages, features, and uses will become more apparent to those skilled in the art as the description proceeds when considered along with the accompanying drawing in which.

Figure 1:
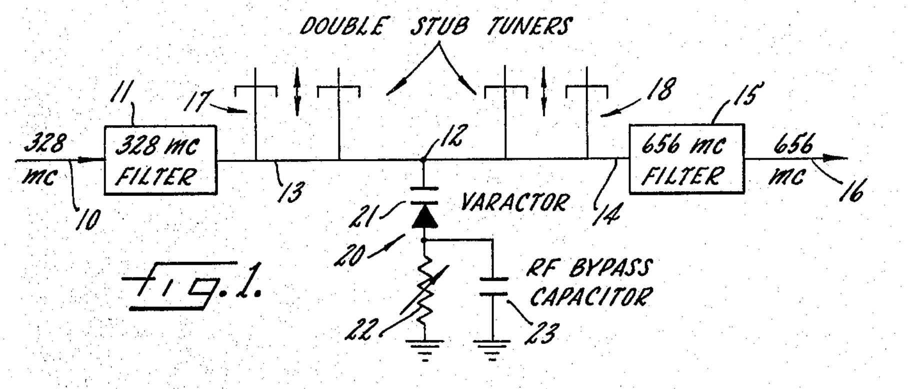
FIGURE 1 is a partial circuit schematic and partial block diagram of a varactor diode frequency doubler circuit.

Referring more particularly to FIGURE 1, a fundamental frequency to be multiplied is conducted over a frequency conductor 10 through a filter circuit 11 to a junction point 12 over conductor means 13. The frequency conductor may be a coaxial line or coaxial conductor or any other suitable means of conducting frequency signals for multiplication. The terminal point 12 is coupled through a conductor means 14 and through a filter 15, the output of which is taken from the output conductor 16 of filter 15. The input frequency conductor 13 between the filter 11 and the junction point 12 has a double stub tuner 17 connected thereto while the output frequency conductor 14 has a double stub tuner 18 coupled thereto. For the purpose of example in describing the multiplication characteristics of this invention the input conductor 10 is identified as receiving a fundamental frequency signal of 328 megacycles (mc.). Likewise, the filter 11 is designed to pass the fundamental input frequency of 328 mc. and to produce an open circuit for all other signals varying from this fundamental frequency. The double stub tuner 17 is tuned to the 328 mc. signal so that the fundamental frequency of 328 mc. is the only frequency signal that can exist in the input on the input frequency conductor 13. The double stub tuner 18 is tuned to a frequency exactly double the input fundamental frequency, or 656 mc., and the filter 15 is designed to pass only the 656 mc. signal on the output 16.

Frequency multiplication is produced by a frequency multiplication circuit identified by the reference character 20 which includes a varactor 21, a potentiometer 22, and a radio frequency (RF) bypass capacitor 23. It is well understood by those skilled in the art that varactors have the capability of producing strong harmonics from a fundamental frequency. These capabilities of varactors are set forth in proceedings of the Institute of Radio Engineers, volume 47, No. 12 for December 1959, in the article entitled "Frequency Multiplication with Nonlinear Capacitors—A Circuit Analysis" by D. B. Leeson and S. Weinreb, pages 2076–2084. The cathode of varactor 21 is coupled directly to the junction point 12 in the frequency conductor and the anode of the varactor diode is coupled to a fixed potential such as ground through a parallel network consisting of the potentiometer 22 and the RF bypass capacitor 23. The potentiometer 22 may likewise be a variable resistance where desired.

*Operation of FIGURE 1*

In the operation of the frequency multiplier circuit of FIGURE 1, the input of 328 mc. applied over the frequency conductor, such as a coaxial cable 10, is filtered in filter 11 and tuned by the double stub tuner 17 to produce a pure fundamental frequency of 328 mc. on the input 13 at the junction point 12. The varactor diode 21 produces strong harmonics of the fundamental frequency of 328 mc., the first harmonic being tuned by the double stub tuner 18 and filtered by the filter circuit 15 to produce on the output a frequency signal of 656 mc. A portion of the fundamental frequency is rectified in the varactor diode 21 to produce a current flow through the resistance portion of the potentiometer 22 thereby producing a self bias on the anode of the varactor diode 21. Any leak-through RF frequency will be bypassed directly to ground by way of the capacitor 23 thereby producing a pure D.C. self-biasing voltage. The efficiency of the varactor diode 21 varies in accordance with the bias thereon and this efficiency can be made optimum by adjustment of the potentiometer 22. It has been found that by adjusting the potentiometer 22 to its optimum position of producing varactor diode 21 efficiency the "times 2" multiplier will have a loss of only three decibels (db), exclusive of filter losses. While the varactor diode 21 is shown as being coupled with the cathode connected to the terminal point 12 and the anode to the potentiometer and RF bypass capacitor network, it is to be understood that frequency multiplication can be obtained with the varactor in reverse orientation for different polarity results in biasing requirements. It is also to be understood that frequency multiplication can be readily produced from other fundamental frequencies than the 328 mc. shown, this particular fundamental frequency being used only for the purpose of example herein.

Figure 2:
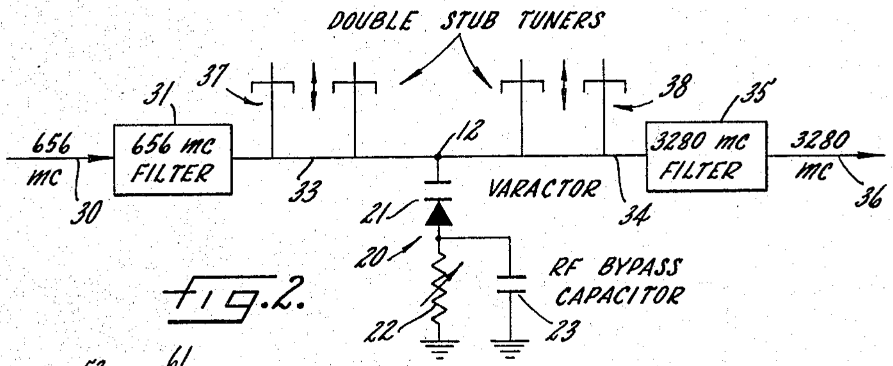
FIGURE 2 is a partial circuit schematic and partial block diagram of a varactor diode multiplier circuit having a multiplication factor of 5.

Referring more particularly to FIGURE 2, where like reference characters are used for like parts in FIGURE 1, a block circuit diagram is shown similar to that of FIGURE 1 except that in this frequency multiplier circuit the fundamental frequency is multiplied five times. Purely for the purpose of example herein, a fundamental frequency of 656 mc. is applied to the input frequency conductor such as a coaxial line 30 which is filtered in the filter 31 and conducted over the coaxial line 33 to the junction point 12. The frequency conductor 33 between the filter 31 and the junction point 12 has a double stub tuner 37 coupled thereto, this double stub tuner being tuned to the fundamental frequency of 656 mc. The frequency conductor 34 between the junction point 12 and an output filter 35 likewise has a double stub tuner 38 tuned to a frequency 5 times the fundamental frequency. The output filter 35 is constructed and arranged to filter at a frequency 5 times that of the fundamental frequency on the input 30. The multiplied output of 3,280 mc. is conducted over the output 36 from the filter 35. The same frequency multiplier circuit 20 as illustrated in FIGURE 1 is coupled to the terminal 12 to produce, in this example, strong harmonics of the fundamental frequency of 656 mc. The tuner 38 being tuned to 3,280 mc. isolates the output conductor 34 from the fundamental frequency. The output filter 35 passes only the 3,280 mc. signals, opening the circuit to all other frequencies, so that the fundamental frequency of 656 mc. is multiplied five times on the output 36. The potentiometer 22 is adjustable to produce optimum efficiency of the varactor diode frequency multiplier circuit 20 and it has been found that only 9 db loss is incurred in the "times 5" multiplier circuit of FIGURE 2.

Figure 3:
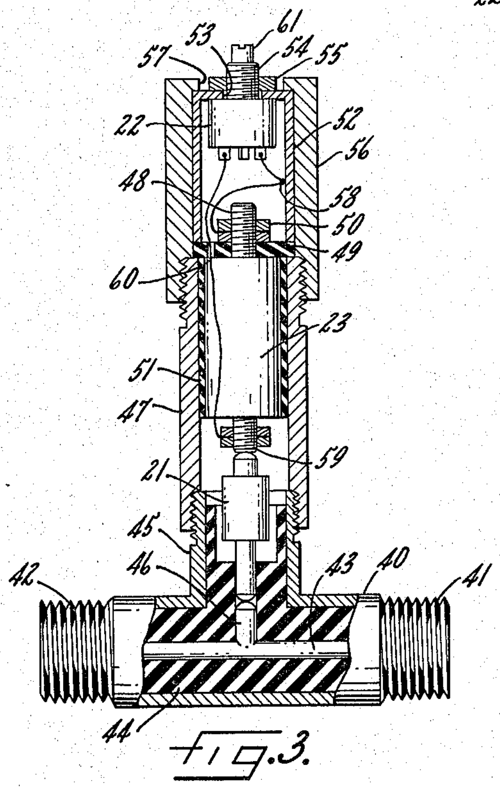
FIGURE 3 is a cross-sectional and elevational view of the varactor diode multiplier circuit elements in a housing or holder means.

The varactor diode multiplier circuit 20 may best be housed in a holder means more particularly shown in FIGURE 3. In this figure a coaxial cable coupler 40, having threaded means 41 and 42 for coupling in a coaxial line, is used to support the holding means for the varactor diode multiplier circuit. The coaxial line coupler has its central conductor 43 supported in an insulating material 44, such as "Teflon" or any other suitable electrical insulating material, for connection to the central conductor of the line through the coupling joints 41 and 42. The coupler 40 has an upstanding T-portion 45 with a branch central conductor 46 connecting the conductor 43. The branch central conductor 46 terminates in a cylindrical well within the "Teflon," or any other suitable insulating material 44, which conductor 46 is engaged by one terminal of the varactor diode 21. The upper portion of the T-formation 45 is externally threaded to receive an internally threaded cylindrical metallic member 47. Within the upper cylindrical portion of the cylindrical member 47 is the RF bypass capacitor 23 having one terminal 48 passing through a disc 49 of "Teflon," or other suitable material, and held in that position by terminal nuts 50. The capacitor 23 is wrapped in "Teflon" tape or other suitable material 51 to electrically insulate it from the walls of the metallic cylindrical member 47. The capacitor 23 may be formed by the cylindrical exterior of the capacitor and the cylindrical member 47 separated by the "Teflon" tape 51. Resting on top of the insulating disc 49 is an inverted metallic cup member 52 having a central opening 53 in the bottom thereof through which the threaded shank 54 of the potentiometer 22 passes and held in position by a nut 55. The inverted cup member 52 is held down in position on the insulating disc 49 by a metallic cylindrical member 56 having an inwardly turned shoulder 57 on the upper end thereof in engagement with the cup member 52. The cylindrical member 56 has the lower end in threaded engagement with the upper end of the cylindrical member 47. The upper terminal 48 of the RF bypass capacitor 23 and one terminal of potentiometer 22 are grounded by conductor means to the inverted metallic cup 52 as by brazing or soldering at the point 58. Another terminal of the potentiometer 22 is connected to the lower terminal 59 of the RF bypass capacitor 23 by a conductor means passing through an opening 60 in the capacitor supporting disc 49. The lower capacitor terminal 59 is held in engagement with the upper terminal of the varactor diode 21 which likewise holds the lower terminal of the varactor 21 in contact with the branch conductor 46 of the coaxial line. As may be readily recognized the holder or housing for the frequency multiplier varactor diode circuit may be readily disassembled to inspect to replace circuit components. The potentiometer adjustable tap may be readily adjusted from the exterior through the shaft means 61 extending through the threaded shank 54 of the potentiometer 22. In this manner the optimum efficiency of the varactor diode multiplier circuit may be accomplished by adjustment of the potentiometer under circuit operation and without the necessity of any additional source of direct current for biasing purposes.

While many modifications and changes may be made in the constructional details of the circuit or of the varactor diode multiplier circuit housing without changing the spirit and intent of this invention, it is to be understood that I desire to be limited only by the scope of the appended claims.

I claim:

1. A self-biasing varactor frequency multiplier circuit for a coaxial line having an input portion wtih a filter and a double-stub tuner for filtering and tuning the signal at the input fundamental frequency and having an output portion with a filter and a double-stub tuner for filtering and tuning the signal at the multiplied output frequency, the invention which comprises:

a coaxial line T-coupler housing for coupling the input and output coaxial line portions in alignment;

an electrically conductive cylindrical extension detachably supported on the lateral leg of the T-coupler housing retaining a capacitor with aligned terminals therein;

a varactor diode having a cathode terminal engaging said coaxial line for said T-coupler housing and an anode terminal engaging one terminal of said capacitor;

an electrical insulating disc having a central opening for receiving the other terminal of said capacitor and a peripheral portion thereof resting on said cylindrical extension for supporting said capacitor in said cylindrical extension;

an electrically conductive inverted cylindrical cup having an opening in the bottom thereof engaging said peripheral portion of said insulating disc;

a potentiometer detachably fixed in the opening of said inverted cylindrical cup, one terminal of said potentiometer and the other terminal of said capacitor being coupled to said inverted cylindrical cup to ground same and a second terminal of said potentiometer being coupled by conductor means to said one terminal of said capacitor; and an electrically conductive retaining cylindrical member having an inwardly directed shoulder on the upper end thereof in compressive engagement with said inverted cylindrical cup and the lower end threadedly engaging said cylindrical extension detachably retaining said varactor diode, said capacitor, and said potentiometer on said coaxial line T-coupler housing with the adjustable tap of said potentiometer extending to the exterior of said inverted cylindrical cup and said retaining cylindrical member whereby a frequency signal being conducted over the coaxial line of said coaxial line T-coupler housing will have harmonics generated therefrom by said varactor diode and the bias voltage produced by the rectification characteristics of said varactor diode is adjustable by said potentiometer to effect optimum efficiency of said harmonic generation.

2. A self-biasing varactor frequency multiplier circuit as set forth in claim 1 wherein said electrically conductive cylindrical extension retaining a capacitor has the capacitor exterior separated from said cylindrical extension by a thin electrically insulated film to provide capacitance between said capacitor exterior and cylindrical extension.

References Cited by the Examiner

UNITED STATES PATENTS

| | | | |
|---|---|---|---|
| 3,085,205 | 4/1963 | Sante. | |
| 3,125,725 | 3/1964 | Chang | 325—449 |
| 3,165,690 | 1/1965 | Kaufman | 321—69 |
| 3,169,227 | 2/1965 | Closson | 330—4.9 |
| 3,175,164 | 3/1965 | Schreiner | 330—4.9 |

OTHER REFERENCES

Linear Amplification and Generation by Boff, Moll and Shen; 1960 International Solid-State Circuit Conference, Pub. February 1960; pp. 50 and 51.

JOHN F. COUCH, *Primary Examiner.*

G. GOLDBERG, *Assistant Examiner.*